(12) United States Patent
Su et al.

(10) Patent No.: US 12,513,999 B2
(45) Date of Patent: Dec. 30, 2025

(54) ESD PROTECTION DEVICE

(71) Applicant: Taiwan Semiconductor Manufacturing Company Limited, Hsinchu (TW)

(72) Inventors: Shu-Yu Su, Hsinchu (TW); Jam-Wem Lee, Hsinchu (TW); Wun-Jie Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/359,064

(22) Filed: Jul. 26, 2023

(65) Prior Publication Data

US 2024/0021603 A1 Jan. 18, 2024

Related U.S. Application Data

(63) Continuation of application No. 17/739,357, filed on May 9, 2022, now Pat. No. 11,749,673, which is a continuation of application No. 16/993,399, filed on Aug. 14, 2020, now Pat. No. 11,355,491, which is a continuation of application No. 15/367,304, filed on Dec. 2, 2016, now Pat. No. 10,777,547.

(60) Provisional application No. 62/341,247, filed on May 25, 2016.

(51) Int. Cl.
*H10D 89/60* (2025.01)
*H02H 9/04* (2006.01)

(52) U.S. Cl.
CPC .......... *H10D 89/819* (2025.01); *H02H 9/046* (2013.01); *H10D 89/811* (2025.01)

(58) Field of Classification Search
CPC . H01L 27/0266; H01L 27/0285; H02H 9/046; H10D 89/819; H10D 89/811
See application file for complete search history.

(56) References Cited

U.S. PATENT DOCUMENTS

| 7,529,070 | B2 | 5/2009 | Bhattacharya et al. | |
| 9,368,484 | B1* | 6/2016 | Chen | H01L 29/7851 |
| 9,450,402 | B1 | 9/2016 | Huang et al. | |
| 11,355,491 | B2* | 6/2022 | Su | H01L 27/0285 |
| 11,749,673 | B2* | 9/2023 | Su | H01L 27/0266 |
| | | | | 361/56 |
| 2008/0297960 | A1 | 12/2008 | Chen | |
| 2012/0182654 | A1 | 7/2012 | Wang et al. | |
| 2013/0027820 | A1 | 1/2013 | Padilla et al. | |
| 2013/0050885 | A1 | 2/2013 | Chen et al. | |
| 2013/0265676 | A1 | 10/2013 | Prabhu et al. | |
| 2015/0214730 | A1* | 7/2015 | Chuang | H02H 9/04 |
| | | | | 361/56 |

(Continued)

*Primary Examiner* — Thienvu V Tran
*Assistant Examiner* — Christopher J Clark
(74) *Attorney, Agent, or Firm* — Jones Day

(57) ABSTRACT

Systems and methods for protecting a device from an electrostatic discharge (ESD) event are provided. A resistor-capacitor (RC) trigger circuit and a driver circuit are provided. The RC trigger circuit is configured to provide an ESD protection signal to the driver circuit. A discharge circuit includes a first metal oxide semiconductor (MOS) transistor and a second MOS transistor connected in series between a first voltage potential and a second voltage potential. The driver circuit provides one or more signals for turning the first and second MOS transistors on and off.

20 Claims, 6 Drawing Sheets

(56) References Cited

U.S. PATENT DOCUMENTS

| | | | |
|---|---|---|---|
| 2015/0249334 A1* | 9/2015 | Chen | H02H 9/046 |
| | | | 361/56 |
| 2015/0288173 A1 | 10/2015 | Chen et al. | |
| 2021/0119446 A1 | 4/2021 | Lin | |

* cited by examiner

ESD PROTECTION DEVICE

CROSS-REFERENCE TO RELATED APPLICATIONS

This application is a continuation application of U.S. patent application Ser. No. 17/739,357, filed May 9, 2022; which is a continuation application of U.S. patent application Ser. No. 16/993,399, filed Aug. 14, 2020; which is a continuation application of U.S. patent application Ser. No. 15/367,304, filed Dec. 2, 2016; which claims priority to U.S. Provisional Patent Application No. 62/341,247, filed May 25, 2016, entitled "ESD Protection Device"; all of which are incorporated herein by reference in their entireties.

BACKGROUND

Electrostatic discharge (ESD) is a rapid discharge that flows between two objects due to a build-up of static charge. ESD may destroy semiconductor devices because the rapid discharge can produce a relatively large current. In order to reduce semiconductor failures due to ESD, ESD protection circuits have been developed to provide a current discharge path. When an ESD event occurs, the discharge current is conducted through the discharge path without going through the internal circuits to be protected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
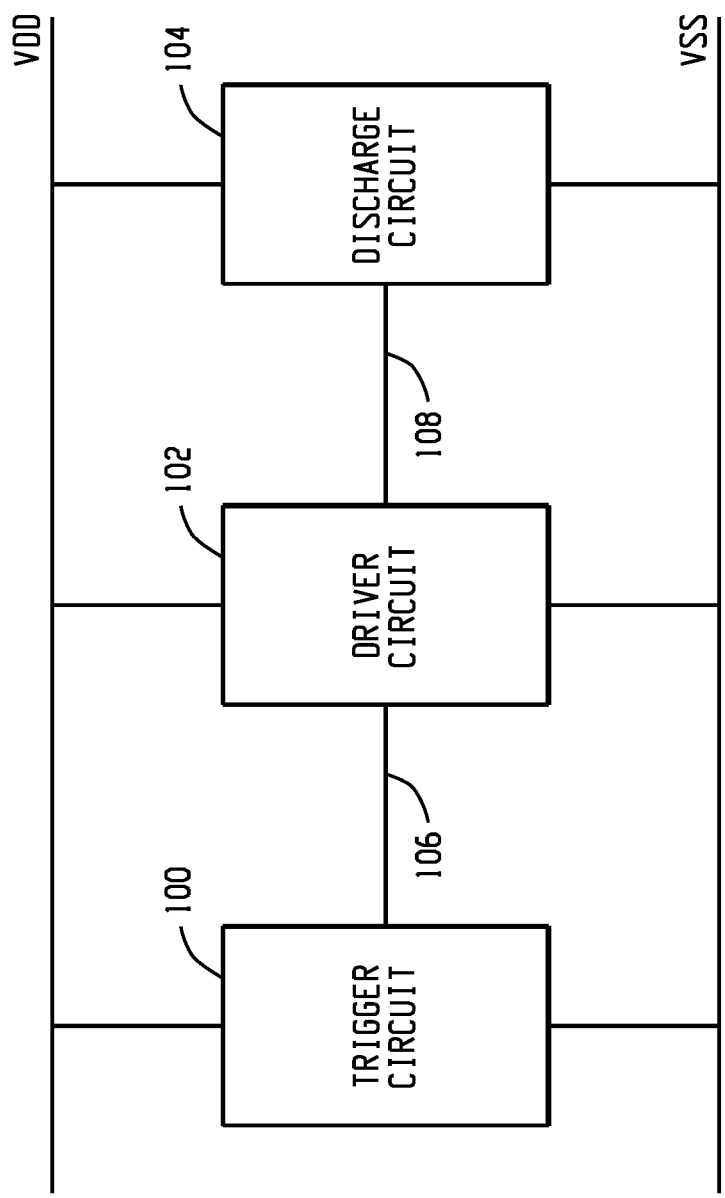
FIG. 1 illustrates a block diagram of an electrostatic discharge (ESD) protection device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a block diagram of an electrostatic discharge (ESD) protection device, in accordance with some embodiments. The ESD protection device comprises a trigger circuit 100, a driver circuit 102, and a discharge circuit 104. As shown in FIG. 1, the ESD protection device is coupled between a first voltage potential VDD and a second voltage potential VSS. More particularly, each block of the ESD protection device has a first terminal coupled to the first voltage potential VDD and a second terminal coupled to the second voltage potential VSS. The trigger circuit 100 is coupled (e.g., electrically connected) to the driver circuit 102, as indicated by connection 106, and is configured to provide an ESD protection signal to the driver circuit 102. Example ESD protection signals are described in detail below.

The driver circuit 102 is coupled to the discharge circuit 104 via one or more connections 108 and is configured to provide one or more signals to the discharge circuit 104. The discharge circuit 104 includes first and second metal oxide semiconductor (MOS) transistors connected in series between the first voltage potential VDD and the second voltage potential VSS. In embodiments, the one or more signals generated by the driver circuit 102 are used to turn the first and second MOS transistors of the discharge circuit 104 on and off. For example, when an ESD event occurs, the one or more signals are used to turn the first and second MOS transistors on, such that the transistors form an ESD current discharge path. After the ESD event is complete, the one or more signals are used to turn the first and second MOS transistors off, in embodiments.

Figure 3:
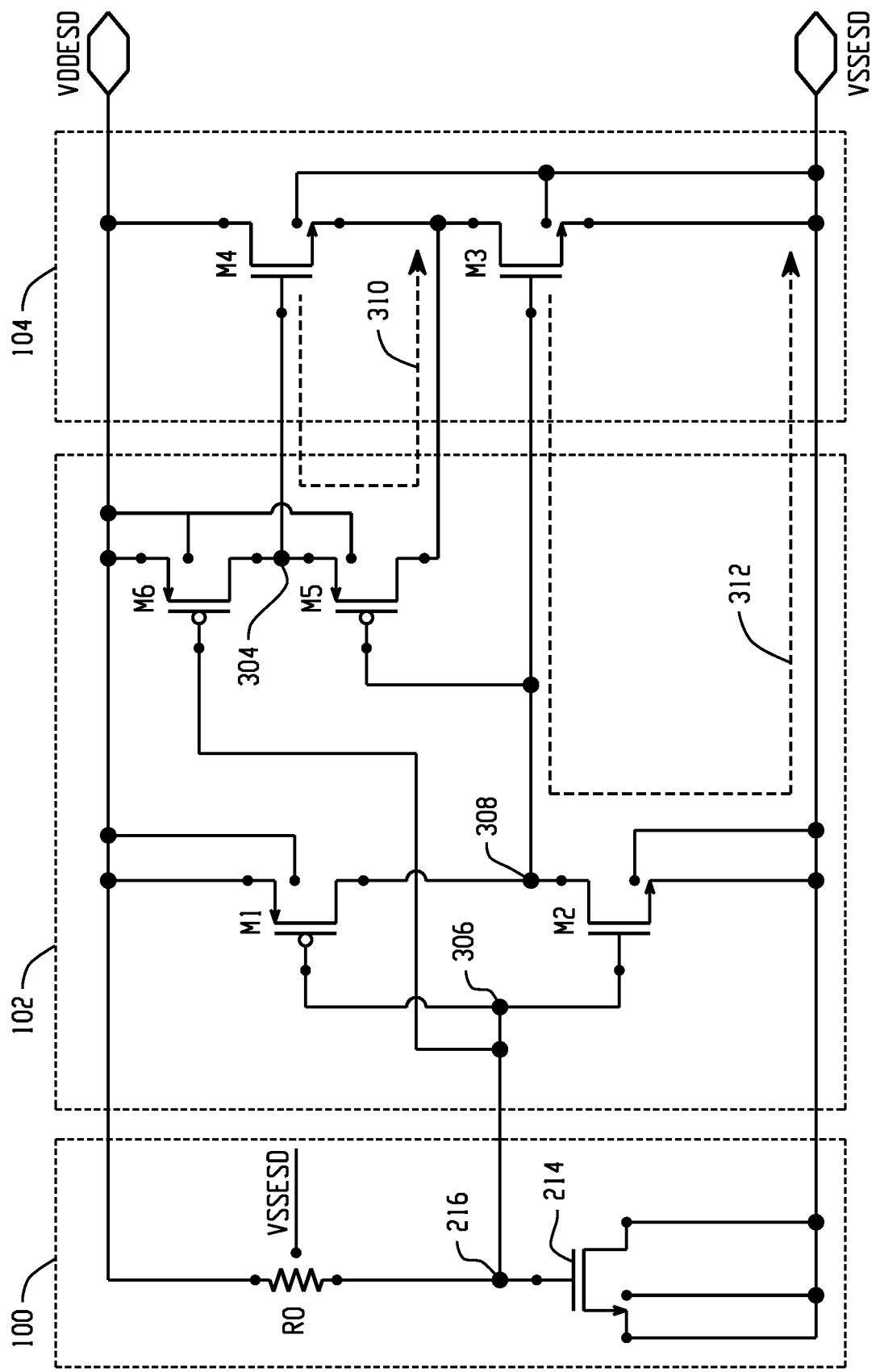
FIG. 3 illustrates another example embodiment of the ESD protection device of FIG. 1, in accordance with some embodiments.
Figure 4:
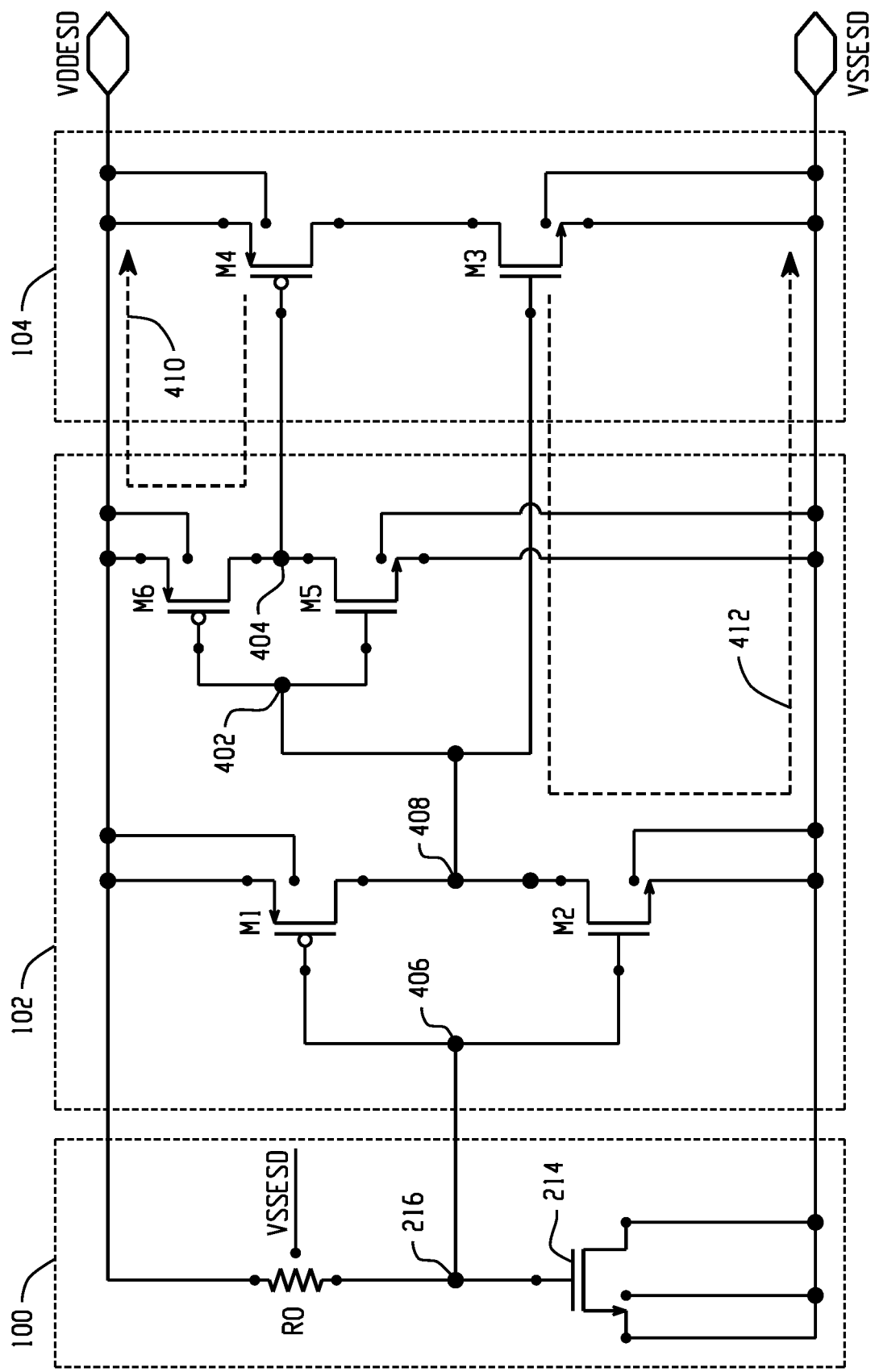
FIG. 4 illustrates another example embodiment of the ESD protection device of FIG. 1, in accordance with some embodiments.

As explained in further detail below, to turn the first and second MOS transistors off, in embodiments, the driver circuit 102 (i) causes a gate terminal of the first MOS transistor to be shorted to a source terminal of the first MOS transistor via a first circuit path, and (ii) causes a gate terminal of the second MOS transistor to be shorted to a source terminal of the second MOS transistor via a second circuit path that is different than the first circuit path. With the gate terminal shorted to the source terminal of a respective MOS transistor, a voltage difference between the gate and source terminals (i.e., $V_{GS}$) is approximately equal to zero, such that the MOS transistor is turned off and the leakage current of the MOS transistor is small (~0.3 uA). To turn the first and second MOS transistors on, in embodiments, the driver circuit 102 decouples the gate and source terminals of the respective transistors and provides signals that cause current to flow through the transistors. Examples of the first and second MOS transistors being turned off and on by the driver circuit 102 are illustrated in FIGS. 2-4 and explained in further detail below.

When an ESD voltage spike is applied between the first voltage potential VDD and the second voltage potential VSS, the trigger circuit 100 may detect the voltage spike and subsequently turn on the first and second MOS transistors of the discharge circuit 104 via the driver circuit 102. The turn-on of the first and second MOS transistors forms a path in which a large current is allowed to flow from the first voltage potential VDD to the second voltage potential VSS. The current path from the first voltage potential VDD to the second voltage potential VSS may provide a bypass of the ESD current and clamp the voltage between the first voltage potential VDD and the second voltage potential VSS to a level below the maximum voltage rating of an internal circuit (not shown). Accordingly, the ESD protection circuit helps to ensure that the large voltage spike does not damage the internal circuit being protected.

Figure 2:
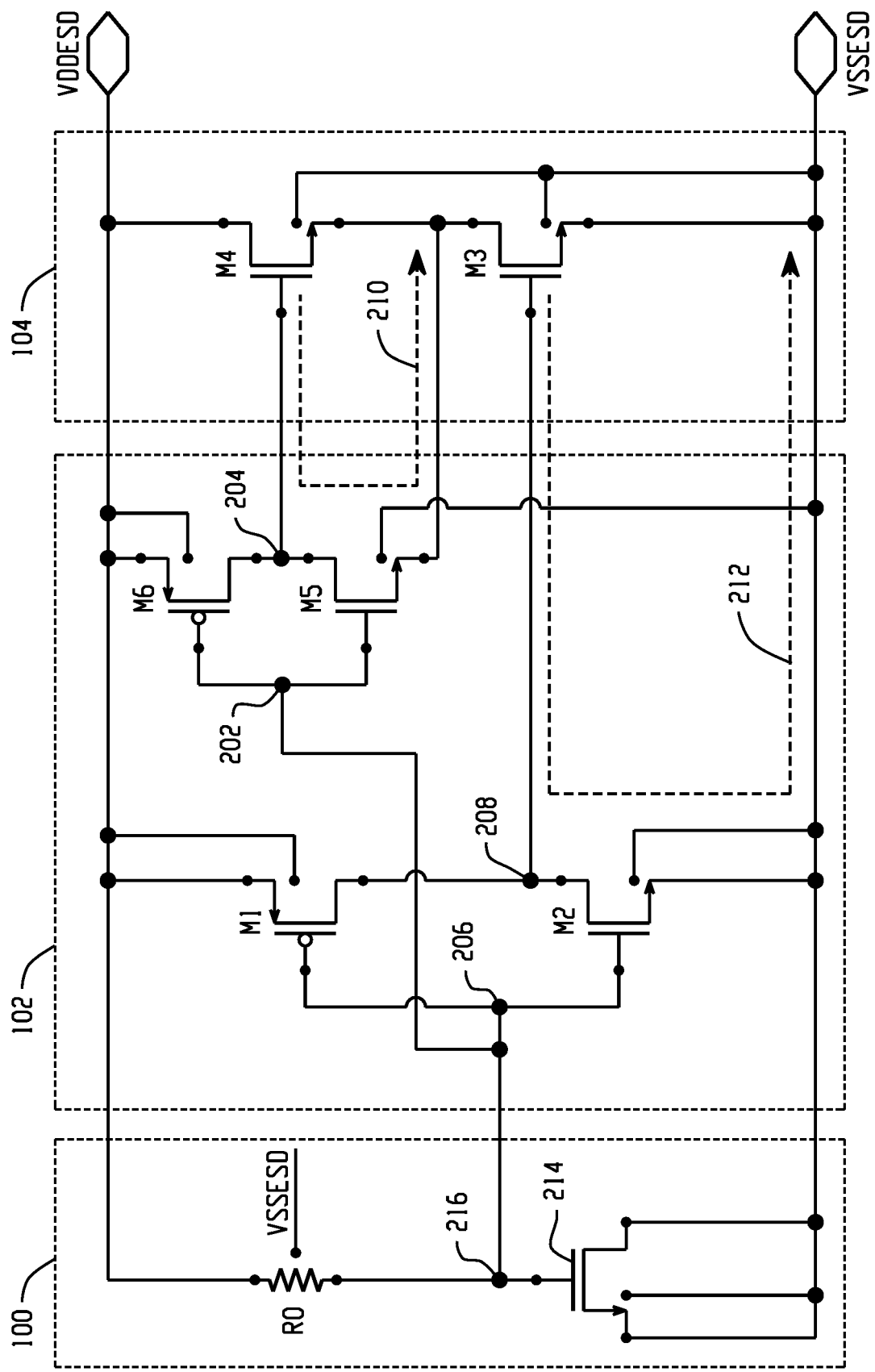
FIG. 2 illustrates in detail an example embodiment of the ESD protection device of FIG. 1, in accordance with some embodiments.

FIG. 2 illustrates in detail an example embodiment of the ESD protection device of FIG. 1, in accordance with some embodiments. In accordance with an embodiment, the driver circuit 102 comprises first and second inverters. The first inverter includes a first p-type metal oxide semiconductor (PMOS) transistor M6 and a first n-type metal oxide semiconductor (NMOS) transistor M5 connected in series between the first voltage potential VDD and the source of M4. The first inverter includes an input node 202 and an output node 204. The second inverter includes a second PMOS transistor M1 and a second NMOS transistor M2 connected in series between the first voltage potential VDD and the source of M3 (or the second voltage potential VSS). The second inverter includes an input node 206 and an output node 208.

The input nodes 202, 206 of the respective first and second inverters receive a signal (e.g., an ESD protection signal) from the trigger circuit 100. The first inverter provides an inverted signal to a gate terminal of a MOS transistor M4 of the discharge circuit 104, and the second inverter likewise provides the inverted signal to a gate terminal of a MOS transistor M3 of the discharge circuit 104. As illustrated in the figure, the MOS transistors M3 and M4 are connected in series between the first voltage potential VDD and the second voltage potential VSS. In the example of FIG. 2, both the first and second MOS transistors M3, M4 are NMOS transistors. In other embodiments, the stacked first and second MOS transistors M3, M4 of the discharge circuit 104 are both PMOS transistors (e.g., with one or more changes made to the circuits 100, 102, etc.). In other embodiments, M3 is an NMOS transistor, and M4 is a PMOS transistor (e.g., with one or more changes made to the circuits 100, 102, etc.).

As shown in the illustration of FIG. 2, the gate terminal of the MOS transistor M4 is coupled to the node 204 of the driver circuit 102, and the gate terminal of the MOS transistor M3 is coupled to the different node 208 of the driver circuit 102. Because the gate terminals of the respective MOS transistors M3, M4 are coupled to the separate and distinct nodes 204, 208 of the driver circuit 102, it is evident that the gate terminals of the respective MOS transistors M3, M4 are not tied together (i.e., the gate terminal of the MOS transistor M3 is not shorted to the gate terminal of the MOS transistor M4).

It is noted that although FIG. 2 illustrates the driver circuit 102 as including a single inverter coupled to the gate terminal of the MOS transistor M4 and a single inverter coupled to the gate terminal of the MOS transistor M3, the driver circuit 102 may accommodate any number of inverters connected in cascade. Thus, for instance, in embodiments, the gate terminal of the MOS transistor M4 is connected to an output of a third (i.e., final) inverter of a series of three inverters connected in cascade. Likewise, in embodiments, the gate terminal of the MOS transistor M3 is connected to an output node of three inverters connected in cascade. Other numbers of inverters connected in cascade are utilized in other examples. One of ordinary skill in the art would recognize other variations, alternatives, and modifications to the circuit diagram of FIG. 2. For instance, one of ordinary skill in the art would recognize that PMOS transistors may be used in place of NMOS transistors (e.g., with one or more changes made to the circuits 100, 102, etc.).

In the example of FIG. 2, the trigger circuit 100 is a resistor-capacitor (RC) trigger circuit having a resistor R0 and a capacitor 214 connected in series and coupled together at a node 216. In accordance with an embodiment, the capacitor 214 is implemented by connecting a drain and a source of a MOS transistor (e.g., an NMOS transistor) together as shown in FIG. 2. It should be noted that while FIG. 2 illustrates the capacitor 214 formed by a single NMOS transistor, in other examples, the capacitor 214 is formed by any number of MOS transistors (e.g., NMOS transistors) connected in parallel. The input node 202 of the first inverter (i.e., the inverter formed by the transistors M5 and M6) and the input node 206 of the second inverter (i.e., the inverter formed by the transistors M1 and M2) are coupled to the node 216 of the trigger circuit 100.

During a normal mode of operation of the ESD protection device (e.g., when the first voltage potential VDD is free of ESD spikes), the capacitor 214 is fully charged to a logic high state. As a result, the MOS transistor M5 of the first inverter is turned on and able to conduct current. In this turned-on state, a voltage drop between drain and source terminals (i.e., $V_{DS}$) of the MOS transistor M5 is approximately equal to zero. As can be seen in FIG. 2, the gate of the MOS transistor M4 of the discharge circuit 104 is coupled to the drain of the MOS transistor M5, and the source of M4 is coupled to the source of M5. With these connections, a voltage drop between the gate and source terminals (i.e., $V_{GS}$) of the MOS transistor M4 is approximately equal to zero, such that the MOS transistor M4 is turned off. Accordingly, it can be seen that during normal operation, the gate terminal of the MOS transistor M4 is shorted to the source terminal of the MOS transistor M4 via a first circuit path 210. The driver circuit 102 accomplishes this shorting of the gate and source terminals by causing the $V_{DS}$ voltage drop of the MOS transistor M5 to be approximately equal to zero, as described above.

Continuing the above description of the normal mode of operation of the ESD protection device, in this mode of operation, the MOS transistor M2 of the second inverter is turned on and able to conduct current (i.e., as a result of the capacitor 214 being charged to a logic high state). In this turned-on state, a voltage drop between drain and source terminals (i.e., $V_{DS}$) of the MOS transistor M2 is approximately equal to zero. As can be seen in FIG. 2, the gate of the MOS transistor M3 of the discharge circuit 104 is coupled to the drain of the MOS transistor M2, and the source of M3 is coupled to the source of M2. With these connections, a voltage drop between the gate and source terminals (i.e., $V_{GS}$) of the MOS transistor M3 is approximately equal to zero, such that the MOS transistor M3 is turned off. Accordingly, it can be seen that during normal operation, the gate terminal of the MOS transistor M3 is shorted to the source terminal of the MOS transistor M3 via a second circuit path 212. The second circuit path 212 is different than the first circuit path 210. It is thus noted that the gate terminals of the respective MOS transistors M4, M3 are not tied together. It is further noted that when the transistors M4, M3 are turned off, the gate terminals of the respective transistors are shorted to their corresponding source terminals via the separate and distinct circuit paths 210, 212.

In the normal mode of operation of the ESD protection device, turning off the MOS transistors M4, M3 of the discharge circuit 104 (as described above) eliminates or reduces an amount of leakage current flowing from the first voltage potential VDD to the second voltage potential VSS. In embodiments, the RC time constant of the trigger circuit 100 is in the microsecond range or even hundreds of nanoseconds (e.g., 0.1 µS), which can prevent false triggering during a normal power up with a rise time in the range of milliseconds. On the other hand, the RC trigger circuit 100 can generate an ESD trigger signal when an ESD voltage spike having nanoseconds rise time is applied to the rail VDD. For example, when a voltage spike (e.g., an ESD spike) occurs at the rail VDD, during the rise time of the voltage spike, the capacitor 214 stays low because the longer RC time constant of the trigger circuit 100 causes a slow increase of the voltage of the capacitor 214.

As a result of the capacitor 214 being at the logic low state during the voltage spike, the MOS transistors M5 and M2 of the driver circuit 102 are turned off, and voltage drops between drain and source terminals (i.e., $V_{DS}$) of the respective transistors M5 and M2 are not equal to zero. Accordingly, voltage drops between gate and source terminals (i.e., $V_{GS}$) of the respective transistors M4 and M3 of the discharge circuit 104 are larger than the threshold voltage, such that these transistors M4 and M3 are turned on. The turn-on of the MOS transistors M4 and M3 provides an ESD current path so that the voltage at rail VDD will be clamped a level below the maximum voltage rating to which the voltage rail VDD is specified. The current path from the first voltage potential VDD to the second voltage potential VSS may provide a bypass of the ESD current, thus helping to ensure that an internal circuit (not shown) is protected and not damaged by the voltage spike.

The approaches of the instant application differ from conventional approaches. In some conventional approaches, ESD protection circuits utilize a single, large FET transistor, which is commonly referred to as a "bigFET." When an ESD event occurs, the large FET transistor is turned on, thus providing a current path between VDD and VSS. During normal operation (e.g., when no ESD events are occurring), the large FET transistor is turned off. Although the large FET is turned off during the normal operation, a leakage current through the large FET is relatively high, in examples. This leakage current through the large FET is attributable to a voltage drop between drain and source terminals (i.e., $V_{DS}$) of the large FET, in examples.

In contrast to these conventional approaches, under the approaches of the instant disclosure, a single, large FET transistor is not used in discharging ESD currents. Rather, as described herein, under the approaches of the instant disclosure, two stacked MOS transistors (e.g., stacked MOS transistors M4, M3 of FIG. 2) are utilized in a discharge circuit. The use of the two stacked MOS transistors (as opposed to the single, large bigFET of the conventional approaches) lowers a leakage current in the discharge circuit. In embodiments, the leakage current of the discharge circuit is lower because the stacked MOS transistors each have a lower $V_{DS}$ voltage drop, as compared to the $V_{DS}$ of the bigFET of the conventional approaches, which results in the lower leakage current. The $V_{DS}$ voltage drops of the stacked MOS transistors are lower than that of the bigFET because the stacked MOS transistors share the same VDD and VSS rails, in examples.

FIG. 3 illustrates another example embodiment of the ESD protection device of FIG. 1, in accordance with some embodiments. In the example embodiment of FIG. 3, the RC trigger circuit 100 and the discharge circuit 104 are the same as or similar to those of FIG. 2, and for brevity, the descriptions of the RC trigger circuit 100 and the discharge circuit 104 are not repeated here. In the example embodiment of FIG. 3, the driver circuit 102 differs from that of FIG. 2, and such differences are explained in detail below.

In accordance with an embodiment, the driver circuit 102 of FIG. 3 comprises an inverter. The inverter includes a p-type metal oxide semiconductor (PMOS) transistor M1 and an n-type metal oxide semiconductor (NMOS) transistor M2 connected in series between the first voltage potential VDD and the second voltage potential VSS. The inverter includes an input node 306 and an output node 308. The driver circuit 102 of FIG. 3 further comprises PMOS transistors M6 and M5 connected in series, as shown in the figure. The PMOS transistors M6 and M5 are coupled together at a node 304.

The input node 306 of the inverter is coupled to the node 216 of the trigger circuit 100, thus enabling the inverter to receive a signal (e.g., an ESD protection signal) from the trigger circuit 100. The inverter provides an inverted signal to (i) a gate terminal of the PMOS transistor M5, and (ii) a gate terminal of the MOS transistor M3 of the discharge circuit 104. In the example of FIG. 3, a gate terminal of the MOS transistor M4 is coupled to the node 304 of the driver circuit 102, as shown in the figure.

When the first voltage potential VDD is free of ESD spikes (also referred to herein as a normal mode of operation of the ESD protection device), the capacitor 214 of the trigger circuit 100 is fully charged to a logic high state. As a result, the MOS transistor M2 of the inverter is turned on and able to conduct current. As explained above with reference to FIG. 2, in this turned-on state, a $V_{DS}$ of the MOS transistor M2 is approximately equal to zero, which causes a voltage drop between the gate and source terminals (i.e., $V_{GS}$) of the MOS transistor M3 to be approximately equal to zero. Accordingly, in the normal mode of operation, the MOS transistor M3 is turned off. The gate terminal of the MOS transistor M3 is thus shorted to the source terminal of the MOS transistor M3 via a first circuit path 312.

Continuing the above description of the normal mode of operation of the ESD protection device, in this mode of operation, because a logic state of the input node 306 of the inverter is "high," a logic state of the output node 308 of the inverter is "low." The gate terminal of the PMOS transistor M5 is coupled to the output node 308 of the inverter and thus takes on the logic low state. As a result, the PMOS transistor M5 is turned on and able to conduct current. In this turned-on state, a $V_{DS}$ of the PMOS transistor M5 is approximately equal to zero, which causes a voltage drop between the gate and source terminals (i.e., $V_{GS}$) of the MOS transistor M4 to be approximately equal to zero. Accordingly, in the normal mode of operation, the MOS transistor M4 is turned off. The gate terminal of the MOS transistor M4 is thus shorted to the source terminal of the MOS transistor M4 via a second circuit path 310. Turning off the MOS transistors M4, M3 during the normal mode of operation eliminates or reduces an amount of leakage current flowing from the first voltage potential VDD to the second voltage potential VSS.

When an ESD event occurs on the first voltage potential VDD, the RC trigger circuit 100 generates an ESD trigger signal. Specifically, when a voltage spike (e.g., an ESD spike) occurs on the rail VDD, during the rise time of the voltage spike, the capacitor 214 stays low. The logic level low of the capacitor 214, present at the node 216 of the trigger circuit 100, is an example of an ESD trigger signal (also referred to herein as an "ESD protection signal"). As a result of the capacitor 214 being at the logic low state, the MOS transistors M5 and M2 of the driver circuit 102 are turned off, thus causing the MOS transistors M4 and M3 of the discharge circuit 104 to turn on. The turning on of the MOS transistors M4 and M3 as a result of the ESD protection signal is described in detail above with reference to FIG. 2. The turn-on of the MOS transistors M4 and M3 provides an ESD current path and thus helps to ensure that an internal circuit (not shown) is protected and not damaged by the voltage spike.

FIG. 4 illustrates another example embodiment of the ESD protection device of FIG. 1, in accordance with some embodiments. In the example embodiment of FIG. 4, the RC trigger circuit 100 is the same as or similar to those of FIGS. 2 and 3. For brevity, the description of the RC trigger circuit 100 is not repeated here. In the example embodiment of FIG. 4, the driver circuit 102 and the discharge circuit 104 differ from those of FIGS. 2 and 3, and such differences are explained in detail below.

In accordance with an embodiment, the driver circuit 102 of FIG. 4 comprises first and second inverters. Although the use of two inverters is similar to the embodiment of FIG. 2, other aspects of the driver circuit 102 are different in FIG. 4, as described below. The first inverter includes a first PMOS transistor M6 and a first NMOS transistor M5 connected in series between the first voltage potential VDD and the second voltage potential VSS. The first inverter includes an input node 402 and an output node 404. The second inverter includes a second PMOS transistor M1 and a second NMOS transistor M2 connected in series between the first voltage potential VDD and the second voltage potential VSS. The second inverter includes an input node 406 and an output node 408.

The input node 406 of the second inverter receives a signal (e.g., an ESD protection signal) from the trigger circuit 100. The second inverter provides an inverted signal to (i) the input node 402 of the first inverter, and (ii) a gate terminal of an NMOS transistor M3 of the discharge circuit 104. To provide the inverted signal to the gate terminal of the NMOS transistor M3, the node 408 of the driver circuit 102 is coupled to this gate terminal. The first inverter inverts the signal received from the second inverter and provides an output signal to a gate terminal of the PMOS transistor M4 of the discharge circuit 104. To provide the output signal to the gate terminal of the PMOS transistor M4, the node 404 of the driver circuit 102 is coupled to this gate terminal. As illustrated in the example of FIG. 4, the PMOS transistor M4 and the NMOS transistor M3 of the discharge circuit 104 are connected in series between the first voltage potential VDD and the second voltage potential VSS. The use of one PMOS transistor and one NMOS transistor in the discharge circuit 104 of FIG. 4 differs from FIGS. 2 and 3, which both used a stack of two NMOS transistors in the discharge circuit 104. It is noted that in other examples, a discharge circuit uses a stack of two PMOS transistors.

In the example of FIG. 4, the input node 406 of the second inverter (i.e., the inverter formed by the transistors M1 and M2) is coupled to the node 216 of the trigger circuit 100. During a normal mode of operation of the ESD protection device (e.g., when the first voltage potential VDD is free of ESD spikes), the capacitor 214 is fully charged to a logic high state. As a result, the MOS transistor M2 of the second inverter is turned on and able to conduct current. In this turned-on state, a voltage drop between drain and source terminals (i.e., $V_{DS}$) of the MOS transistor M2 is approximately equal to zero. Thus, the drain and source terminals of the MOS transistor M2 are at approximately the same voltage potential. As can be seen in FIG. 4, the gate of the MOS transistor M3 of the discharge circuit 104 is coupled to the drain of the MOS transistor M2, and the source of M3 is coupled to the source of M2. With these connections, a voltage drop between the gate and source terminals (i.e., $V_{GS}$) of the MOS transistor M3 is approximately equal to zero, such that the MOS transistor M3 is turned off. Accordingly, it can be seen that during normal operation, the gate terminal of the MOS transistor M3 is shorted to the source terminal of the MOS transistor M3 via a first circuit path 412.

Continuing the above description of the normal mode of operation of the ESD protection device, in this mode of operation, because a logic state of the node 406 of the second inverter is "high," a logic state of the output node 408 of the second inverter is "low." The input node 402 of the first inverter is coupled to the output node 408 and thus takes on the logic level low state. The gate terminal of the PMOS transistor M6 is coupled to the input node 402 of the first inverter, and as a result, the PMOS transistor M6 is turned on and able to conduct current. In this turned on state, a $V_{DS}$ of the PMOS transistor M6 is approximately equal to zero, which causes a voltage drop between the gate and source terminals (i.e., $V_{GS}$) of the PMOS transistor M4 to be approximately equal to zero. Accordingly, in the normal mode of operation, the PMOS transistor M4 is turned off. The gate terminal of the PMOS transistor M4 is thus shorted to the source terminal of the PMOS transistor M4 via a second circuit path 410.

When an ESD event occurs on the first voltage potential VDD, the RC trigger circuit 100 generates an ESD trigger signal. Specifically, when a voltage spike (e.g., an ESD spike) occurs on the rail VDD, during the rise time of the voltage spike, the capacitor 214 stays low, as described above. As a result of the capacitor 214 being at the logic low state, the MOS transistors M6 and M2 of the driver circuit 102 are turned off, and voltage drops between drain and source terminals (i.e., $V_{DS}$) of the respective transistors M6 and M2 are not equal to zero. Accordingly, voltage drops between gate and source terminals (i.e., $V_{GS}$) of the respective transistors M4 and M3 of the discharge circuit 104 are larger than the threshold voltage, such that these transistors M4 and M3 are turned on. The turn-on of the MOS transistors M4 and M3 provides an ESD current path so that the voltage at rail VDD will be clamped a level below the maximum voltage rating to which the voltage rail VDD is specified. The current path from the first voltage potential VDD to the second voltage potential VSS may provide a bypass of the ESD current, thus helping to ensure that an internal circuit (not shown) is protected and not damaged by the voltage spike.

Figure 5:
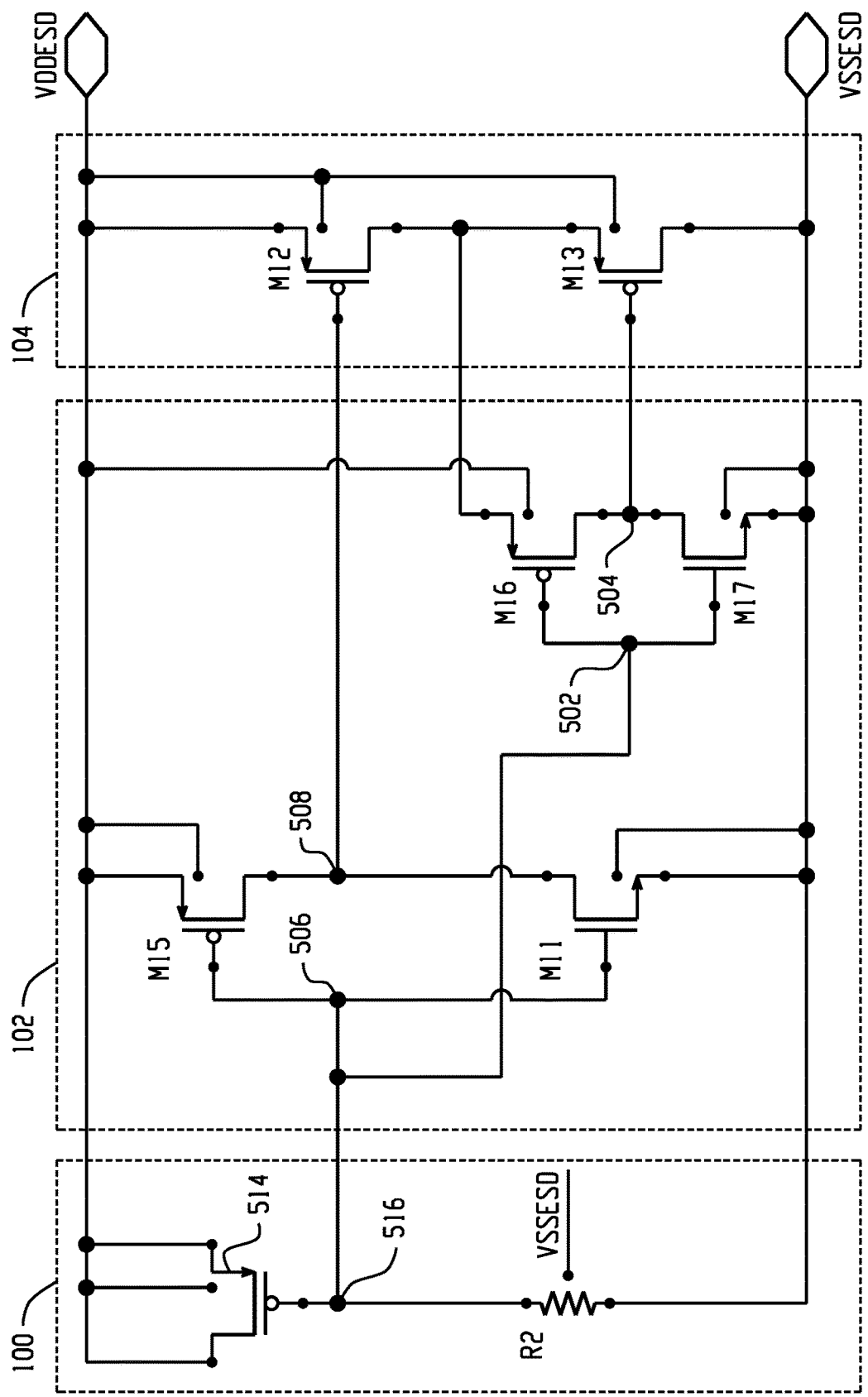
FIG. 5 illustrates in detail an example embodiment of the ESD protection device of FIG. 1, in accordance with some embodiments.

FIG. 5 illustrates another example embodiment of the ESD protection device of FIG. 1, in accordance with some embodiments. In the example of FIG. 5, the discharge circuit 104 uses first and second MOS transistors M12, M13 that are PMOS transistors. This varies from the embodiments of FIGS. 2 and 3, which include discharge circuits with stacked NMOS transistors. The embodiment of FIG. 5 also varies from the embodiment of FIG. 4, which includes a discharge circuit having an NMOS transistor and a PMOS transistor.

In accordance with an embodiment, the driver circuit 102 comprises first and second inverters. The first inverter includes a first PMOS transistor M16 and a first NMOS transistor M17 connected in series between a source of PMOS transistor M13 and the second voltage potential VSS. The first inverter includes an input node 502 and an output node 504. The second inverter includes a second PMOS transistor M15 and a second NMOS transistor M11 connected in series the first voltage potential VDD and the second voltage potential VSS. The second inverter includes an input node 506 and an output node 508.

The input nodes 502, 506 of the respective first and second inverters receive a signal (e.g., an ESD protection signal) from the trigger circuit 100. The first inverter provides an inverted signal to a gate terminal of the PMOS transistor M13 of the discharge circuit 104, and the second inverter likewise provides the inverted signal to a gate terminal of the PMOS transistor M12 of the discharge circuit 104. As illustrated in the figure, the MOS transistors M12 and M13 are connected in series between the first voltage potential VDD and the second voltage potential VSS.

As shown in the illustration of FIG. 5, the gate terminal of the PMOS transistor M13 is coupled to the node 504 of the driver circuit 102, and the gate terminal of the PMOS transistor M12 is coupled to the different node 508 of the driver circuit 102. Because the gate terminals of the respective PMOS transistors M12, M13 are coupled to the separate and distinct nodes 504, 508 of the driver circuit 102, it is evident that the gate terminals of the respective MOS transistors M12, M13 are not tied together (i.e., the gate terminal of the MOS transistor M12 is not shorted to the gate terminal of the MOS transistor M13).

In the example of FIG. 5, the trigger circuit 100 is an RC trigger circuit having a resistor R2 and a capacitor 514 connected in series and coupled together at a node 516. In accordance with an embodiment, the capacitor 514 is implemented by connecting a drain and a source of a MOS transistor (e.g., a PMOS transistor) together as shown in FIG. 5. It should be noted that while FIG. 5 illustrates the capacitor 514 formed by a single PMOS transistor, in other examples, the capacitor 514 is formed by any number of MOS transistors (e.g., PMOS transistors) connected in parallel. The input node 502 of the first inverter (i.e., the inverter formed by the transistors M16 and M17) and the input node 506 of the second inverter (i.e., the inverter formed by the transistors M11 and M15) are coupled to the node 516 of the trigger circuit 100.

During a normal mode of operation of the ESD protection device (e.g., when the first voltage potential VDD is free of ESD spikes), the capacitor 514 is discharged to a logic level low state. As a result, the inputs 502, 506 to the respective first and second inverters receive the logic level low input, causing the outputs 504, 508 of the respective first and second inverters to both have a logic level high state. The logic level high state output by the first and second inverters is received at the gate terminals of the PMOS transistors M12, M13, causing these transistors to be turned off. Accordingly, it can be seen that during normal operation, the PMOS transistors M12, M13 are turned off. In the normal mode of operation of the ESD protection device, turning off the MOS transistors M12, M13 of the discharge circuit 104 eliminates or reduces an amount of leakage current flowing from the first voltage potential VDD to the second voltage potential VSS.

When a voltage spike occurs at the rail VDD, the capacitor 514 charges to a logic level high state. As a result, the inputs 502, 506 to the respective first and second inverters receive the logic level high input, causing the outputs 504, 508 of the respective first and second inverters to both have a logic level low state. The logic level high low output by the first and second inverters is received at the gate terminals of the PMOS transistors M12, M13, causing these transistors to be turned on. The turn-on of the MOS transistors M12 and M13 provides an ESD current path so that the voltage at rail VDD will be clamped a level below the maximum voltage rating to which the voltage rail VDD is specified. The current path from the first voltage potential VDD to the second voltage potential VSS may provide a bypass of the ESD current, thus helping to ensure that an internal circuit (not shown) is protected and not damaged by the voltage spike.

Examples of the trigger circuit 100, driver circuit 102, and discharge circuit 104 are presented herein, and it is noted that other embodiments of the circuits 100, 102, 104 are utilized in other examples. For instance, in embodiments, the driver circuit 102 differs from what is illustrated in FIGS. 2-5. In such embodiments, the driver circuit 102 can include various other circuits that turn on the stacked MOS transistors of the discharge circuit 104 during ESD events and turn off these transistors during normal operation modes. One or more of the transistors utilized in the trigger circuit 100, drive circuit 102, and discharge circuit 104 are Fin Field Effect Transistors (FinFETs), in embodiments. It is thus noted that the approaches of the instant disclosure may be used to provide ESD power clamps for FinFET technology.

Figure 6:
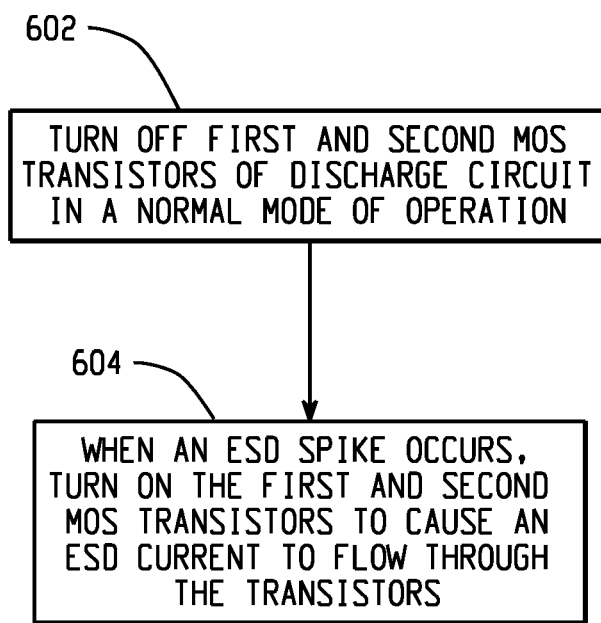
FIG. 6 is a flowchart depicting steps of an example method for protecting a device from an ESD current, in accordance with some embodiments.

FIG. 6 is a flowchart depicting steps of an example method for protecting a device from an ESD event, in accordance with some embodiments. FIG. 6 is described with reference to FIG. 2 above for ease of understanding. But the process of FIG. 6 is applicable to other circuits and systems as well. At 602, a first metal oxide semiconductor (MOS) transistor (e.g., transistor M3 of the discharge circuit 104) and a second MOS transistor (e.g., transistor M4 of the discharge circuit 104) of a discharge circuit are turned off when a first voltage potential (e.g., VDD, as illustrated in FIG. 2) is free of ESD spokes. The first and second MOS transistors are connected in series between the first voltage potential and a second voltage potential (e.g., VSS, as illustrated in FIG. 2). At 604, when an ESD spike is applied to the first voltage potential, the first and second MOS transistors are turned on to cause an ESD current to flow through the transistors. It is noted that in embodiments, the ordering of the steps 602, 604 varies from that depicted in the figure.

The present disclosure is directed to systems and methods for protecting a device from an electrostatic discharge (ESD) event. An example ESD protection device includes a resistor-capacitor (RC) trigger circuit and a driver circuit configured to receive an ESD protection signal from the RC trigger circuit. The ESD protection device also includes a discharge circuit comprising a first metal oxide semiconductor (MOS) transistor and a second MOS transistor connected in series between a first voltage potential and a second voltage potential. The driver circuit provides one or more signals for turning the first and second MOS transistors on and off.

An example discharge circuit of an ESD protection device includes a first metal oxide semiconductor (MOS) transistor and a second MOS transistor connected in series with the first MOS transistor between a first voltage potential and a second voltage potential. The first and second MOS transistors are configured to receive one or more signals from a driver circuit for turning the first and second MOS transistors on and off. When the first and second transistors are turned off, (i) a gate terminal of the first MOS transistor is shorted to a source terminal of the first MOS transistor via a first circuit path, and (ii) a gate terminal of the second MOS transistor is shorted to a source terminal of the second MOS transistor via a second circuit path. The second circuit path is different than the first circuit path.

In an example method for protecting a device from an ESD event, a first metal oxide semiconductor (MOS) transistor and a second MOS transistor of a discharge circuit are turned off when a first voltage potential is free of ESD spokes. The first and second MOS transistors are connected in series between the first voltage potential and a second voltage potential. When an ESD spike is applied to the first voltage potential, the first and second MOS transistors are turned on to cause an ESD current to flow through the transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) protection device comprising:
    a driver circuit comprising a first transistor, a fourth transistor and a plurality of branches, wherein the fourth transistor and the plurality of branches are configured to receive a same ESD protection signal; and
    a discharge circuit comprising a second transistor and a third transistor, wherein the first transistor has a gate terminal connected to a gate terminal of the second transistor and a source or drain terminal connected to a gate terminal of the third transistor, wherein when an ESD spike is applied to ESD protection device, the ESD protection signal turns the first transistor off and the second transistor on, and wherein a source or drain terminal of the fourth transistor is connected to the source or drain terminal of the first transistor and the gate terminal of the third transistor.

2. The ESD protection device of claim 1, further comprising a trigger circuit configured to generate the ESD protection signal.

3. The ESD protection device of claim 2, wherein the trigger circuit includes a resistance element and a capacitance element.

4. The ESD protection device of claim 3, wherein the capacitance element is implemented by connecting a drain terminal and a source terminal of a transistor together.

5. The ESD protection device of claim 3, wherein the capacitance element is formed by two or more transistors connected in parallel.

6. The ESD protection device of claim 2, wherein an RC time constant of the trigger circuit is in a range of 100 to 900 nanoseconds.

7. The ESD protection device of claim 1, wherein when the second transistor of the discharge circuit is turned off, a leakage current of the discharge circuit is less than or substantially equal to 0.3 µA.

8. The ESD protection device of claim 1, wherein the second transistor of the discharge circuit is an NMOS transistor.

9. An electrostatic discharge (ESD) protection circuit comprising:
    a first transistor configured to connect a gate terminal of a second transistor to a source or drain terminal of the second transistor;
    a third transistor configured to connect a gate terminal of a fourth transistor to a source or drain terminal of the fourth transistor; and
    a fifth transistor connected in series with the first transistor, wherein the first transistor has a gate terminal connected to the gate terminal of the fifth transistor, wherein gate terminals of the first, third, and fifth transistors are configured to receive a same ESD protection signal, and at least one of the second and fourth transistors is a PMOS transistor.

10. The ESD protection circuit of claim 9, wherein when the second and fourth transistors are turned off, a leakage current of the second and fourth transistors is less than or equal to 0.3 µA.

11. The ESD protection circuit of claim 9, wherein the second and fourth transistors are a fin field-effect transistor.

12. The ESD protection circuit of claim 9, wherein the second and fourth transistors are connected in series to a ground.

13. The ESD protection circuit of claim 9, wherein both of the second and fourth transistors are PMOS transistors.

14. The ESD protection circuit of claim 9, wherein:
    the second and fourth transistors are connected in series to a voltage potential;
    an ESD current flows through the second and fourth transistors when an ESD spike is applied to the voltage potential; and
    the second and fourth transistors are turned off when the voltage potential is free of the ESD spike.

15. A method comprising:
    turning off a first transistor of a discharge circuit of an ESD protection device,
        wherein the ESD protection device further comprises a driver circuit that includes a second transistor, a fourth transistor, and a plurality of branches, and the fourth transistor and the plurality of branches are configured to receive a same ESD protection signal,
        wherein the first transistor has a gate terminal connected to a gate terminal of the second transistor, the discharge circuit further includes a third transistor, and the second transistor has a source or drain terminal directly connected to a gate terminal of the third transistor,
        wherein a source or drain terminal of the fourth transistor is connected to the source or drain terminal of the second transistor and the gate terminal of the third transistor; and
    when the ESD protection signal is received by the branches, turning on the first transistor.

16. The method of claim 15, wherein the ESD protection device further includes a trigger circuit configured to generate the ESD protection signal.

17. The method of claim 15, wherein the first transistor is connected between a first voltage potential and a second voltage potential.

18. The method of claim 17, wherein an ESD current flows from the first voltage potential to the second voltage potential and clamps a voltage between the first voltage potential and the second voltage potential.

19. The ESD protection circuit of claim 9, wherein the third transistor has a source or drain terminal connected to the source or drain terminal of the fourth transistor.

20. The ESD protection device of claim 1, wherein the second and third transistors are NMOS transistors, and the first and fourth transistors are PMOS transistors.

* * * * *